(12) United States Patent
Feng et al.

(10) Patent No.: US 9,653,603 B1
(45) Date of Patent: May 16, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Li-Wei Feng, Kaohsiung (TW); Shih-Hung Tsai, Tainan (TW); Yi-Fan Li, Tainan (TW); Kun-Hsin Chen, Pingtung County (TW); Tong-Jyun Huang, Tainan (TW); Jyh-Shyang Jenq, Pingtung County (TW); Nan-Yuan Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/139,305

(22) Filed: Apr. 26, 2016

(30) Foreign Application Priority Data

Mar. 8, 2016 (TW) .................. 105106997

(51) Int. Cl.
*H01L 29/78* (2006.01)
*H01L 29/08* (2006.01)
*H01L 29/161* (2006.01)
*H01L 29/165* (2006.01)
*H01L 29/167* (2006.01)
*H01L 29/06* (2006.01)
*H01L 21/265* (2006.01)
(Continued)

(52) U.S. Cl.
CPC .... *H01L 29/7848* (2013.01); *H01L 21/26513* (2013.01); *H01L 21/324* (2013.01); *H01L 29/0653* (2013.01); *H01L 29/0847* (2013.01); *H01L 29/161* (2013.01); *H01L 29/165* (2013.01); *H01L 29/167* (2013.01); *H01L 29/66636* (2013.01); *H01L 29/66803* (2013.01); *H01L 29/7851* (2013.01)

(58) Field of Classification Search
CPC ....... H01L 33/00; H01L 33/007; H01L 29/66; H01L 29/66636; H01L 21/02; H01L 21/0254; H01L 21/02505; H01L 21/02381; H01L 29/78; H01L 29/7848; H01L 29/7851; H01L 29/06; H01L 29/0653; H01L 29/08; H01L 29/0847; H01L 29/16; H01L 29/161; H01L 29/165; H01L 29/167; H01L 29/66803
USPC .......................................................... 257/190
See application file for complete search history.

(56) References Cited

U.S. PATENT DOCUMENTS

| 7,348,284 | B2 | 3/2008 | Doyle et al. |
| 8,497,177 | B1 | 7/2013 | Chang et al. |

(Continued)

OTHER PUBLICATIONS

Li-Wei Feng et al., Title: Semiconductor Fin Structure and Method of Forming the Same, pending U.S. Appl. No. 15/196,024, filed Jun. 28, 2016.

(Continued)

*Primary Examiner* — Monica D Harrison
(74) *Attorney, Agent, or Firm* — Winston Hsu; Scott Margo (57) ABSTRACT

A method for fabricating semiconductor device is disclosed. The method includes the steps of: providing a substrate; forming a recess in the substrate; forming a buffer layer in the recess; forming an epitaxial layer on the buffer layer; and removing part of the epitaxial layer, part of the buffer layer, and part of the substrate to form fin-shaped structures.

17 Claims, 8 Drawing Sheets

(51) Int. Cl.
*H01L 21/324* (2006.01)
*H01L 29/66* (2006.01)

(56) References Cited

U.S. PATENT DOCUMENTS

| | | |
|---|---|---|
| 8,628,989 B2 | 1/2014 | Lochtefeld |
| 9,136,332 B2 * | 9/2015 | Oxland ............... H01L 29/0673 |
| 2014/0151766 A1 | 6/2014 | Eneman et al. |
| 2015/0041764 A1 | 2/2015 | Lee et al. |

OTHER PUBLICATIONS

Chih-Kai Hsu et al., Title: A Method for Fabricating a Fin Field Effect Transistor (FinFET), pending U.S. Appl. No. 15/170,958, filed Jun. 2, 2016.

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming a buffer layer on a substrate before forming fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. The method includes the steps of: providing a substrate; forming a recess in the substrate; forming a buffer layer in the recess; forming an epitaxial layer on the buffer layer; and removing part of the epitaxial layer, part of the buffer layer, and part of the substrate to form fin-shaped structures.

According to another aspect of the present invention, a method for fabricating semiconductor device is disclosed. The method includes the steps of: providing a substrate; forming a fin-shaped structure on the substrate and an insulating layer around the fin-shaped structure; removing part of the fin-shaped structure for forming a recess; forming a buffer layer in the recess; forming an epitaxial layer on the buffer layer; and removing part of the insulating layer to form a shallow trench isolation (STI).

According to another aspect of the present invention, a semiconductor device is disclosed. The semiconductor device includes: a substrate; a fin-shaped structure on the substrate; a buffer layer on the fin-shaped structure, wherein the buffer layer comprises three or more than three elements; and an epitaxial layer on the buffer layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
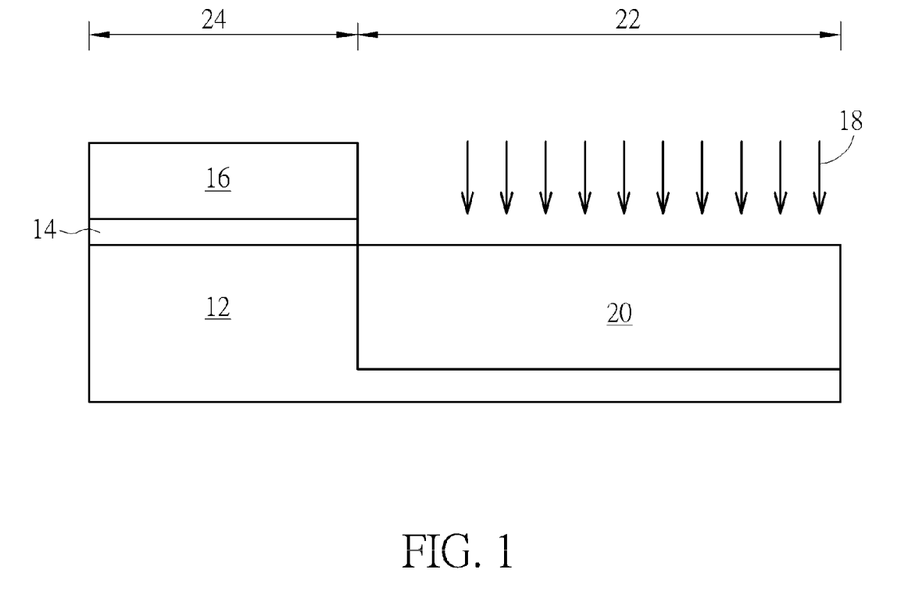
FIGS. 1-7 illustrate a method for fabricating a semiconductor device according to a first embodiment of the present invention.

Referring to FIGS. 1-7, FIGS. 1-7 illustrate a method for fabricating a semiconductor device according to a first embodiment of the present invention. As shown in FIG. 1, a substrate 12, such as a silicon substrate is provided. A hard mask 14 could be selectively formed on the substrate 12, in which the hard mask 14 could be composed of silicon oxide or silicon nitride. Next, a patterned mask, such as a patterned resist 16 is formed on the hard mask 14, and an etching process is conducted to remove part of the hard mask 14 for exposing the surface of the substrate 12. Next, an implant or ion implantation process 18 is conducted to implant dopants into the substrate 12 not covered by the patterned resist 16. This forms a well 20 or well region in the substrate 12 and defines an active region 22 and a peripheral region 24. Preferably, the well 20 on the active region 22 is preferably used to fabricate active devices such as FinFETs in the later process.

In this embodiment, the dopants implanted through the implant process 18 preferably depend on the conductive type of the transistor being fabricated. Since the present embodiment pertains to fabricating a PMOS transistor, n-type dopants are preferably implanted and the well 20 formed in the substrate 12 is preferably a n-well. If a NMOS transistor were to be fabricated, p-type dopants would be implanted into the substrate 12 to form a p-well. After the fabrication of well 20 is completed a thermal anneal process could be selectively conducted to activates the implanted dopants.

Figure 2:
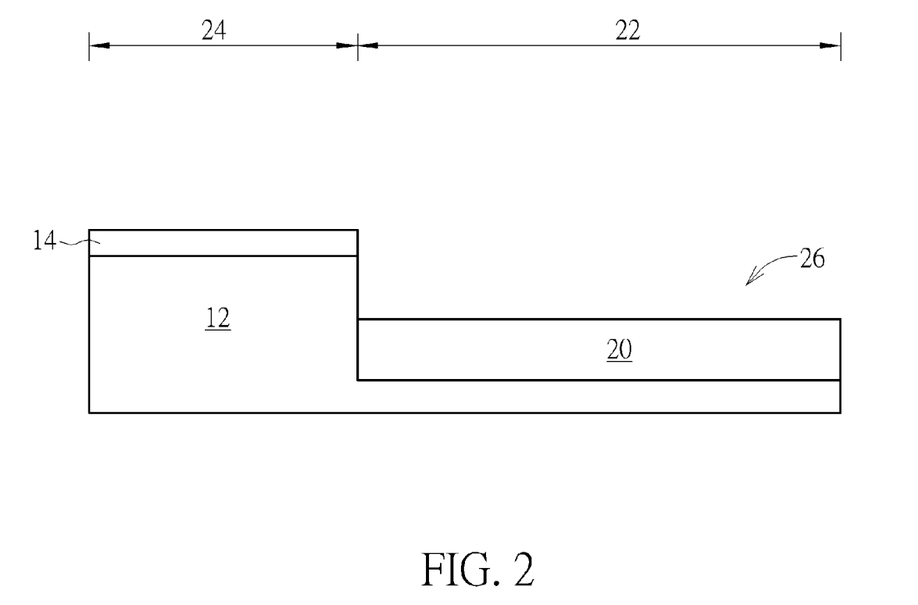

Next, as shown in FIG. 2, another etching process is conducted by either using the patterned resist 16 as mask or stripping the patterned resist 16 and then using the patterned hard mask 14 as mask to remove part of the substrate 12 including the well 20 to form a recess 26 in the substrate 12.

It should be noted that even though the well 20 is formed before the recess 26 in this embodiment, the order for forming the well 20 and recess 26 is not limited to the one disclosed in this embodiment. For instance, it would also be desirable to conduct an etching process to remove part of the substrate 12 for forming a recess 26 after forming the patterned resist 16, and then conducts an implant process to form a well 20 in the substrate 12 and under the recess 26, which is also within the scope of the present invention.

Figure 3:
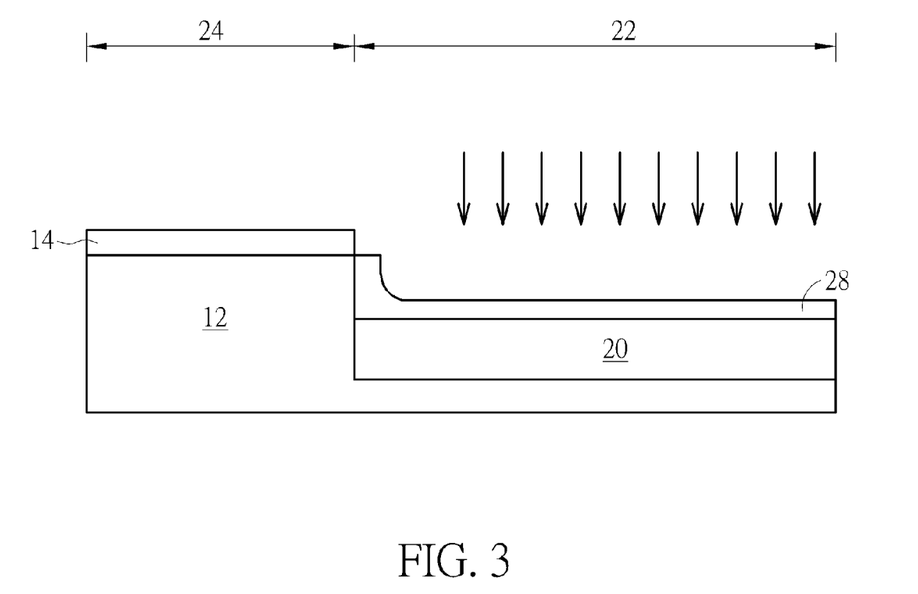

Next, as shown in FIG. 3, a buffer layer 28 is formed in the recess 26 and on the surface of the well 20. In this embodiment, the buffer layer 28 is preferably a buffer material layer utilized for adjusting stress, which is preferably composed of silicon germanium (SiGe), but could also be selected from the group consisting of Si, Ge, SiC, GaAs, InP, InGaAs, InAlP, and elementary group III-V semiconductors.

According to an embodiment of the present invention, the formation of the buffer layer 28 could be accomplished by forming a buffer layer with in-situly doped dopants directly, in which the dopants within the buffer layer 28 is preferably selected from the ion group consisting of P, As, Sb and Bi.

Next, another ion implantation process is conducted to alter the lattice structure of the buffer layer 28 through an amorphization process, in which the ions implanted could be selected from dopants not carrying charge or dopants carrying charge. If the implanted dopants were dopants not carrying charge, the buffer layer 28 formed could be serving as a stress adjustment layer between the well 20 and epitaxial layer formed afterwards. If the implanted dopants were dopants carrying charge and due to the fact that the implanted dopants and the well 20 share same conductive type and the concentration of the ions is higher than the well 20, the buffer layer 28 formed could be serving as a stress adjustment layer as well as an isolation structure between the well 20 and an epitaxial layer formed afterwards. In this embodiment, the implanted dopants could be selected from the group consisting of P, As, Sb, Bi, C, and F.

It should be noted that the aforementioned dopants implanted into the buffer layer 28 from in-situ doping process or extra ion implantation thereafter could include one type or more types of dopants listed above, so that the buffer layer 28 formed could include at least three or more elements. Taking the buffer layer 28 composed of SiGe as an example, if at least one element or dopant such as phosphorus (P) is implanted into the buffer layer 28, the buffer layer 28 would eventually include silicon, germanium, and phosphorus. If one more element such as arsenic (As) is added to the buffer layer 28, the buffer layer 28 would have four elements including silicon, germanium, phosphorus, and arsenic. After the buffer layer 28 containing dopants is formed, a thermal treatment could be conducted selectively to remove defect, repair lattice structure, and recrystallize.

Figure 4:
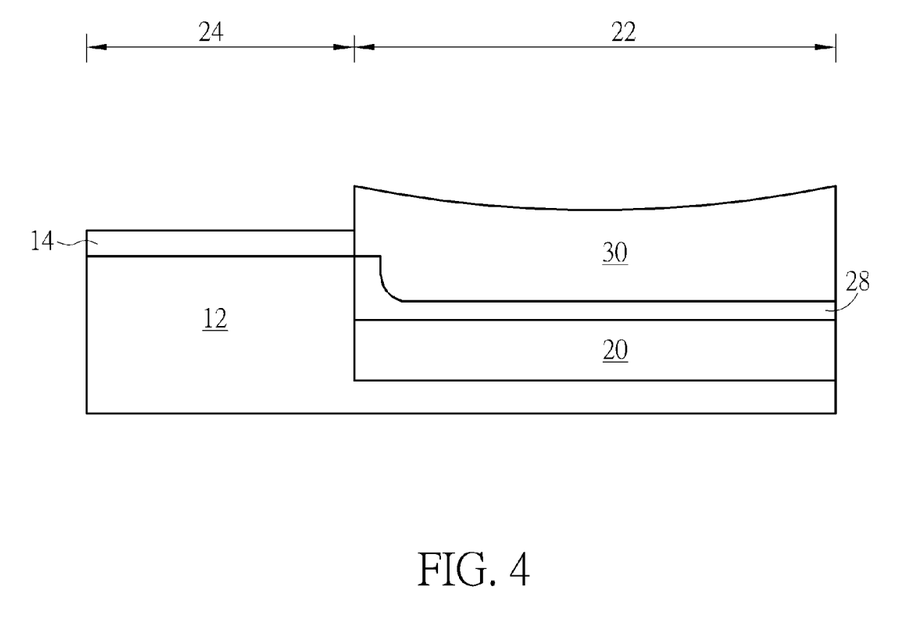

Next, as shown in FIG. 4, a growth process is conducted by using selective epitaxial growth process to form an epitaxial layer 30 on the buffer layer 28, in which a top surface of the epitaxial layer 30 is preferably higher than the top surfaces of the surrounding substrate 12 and hard mask 14. In this embodiment, the epitaxial layer 30 and buffer layer 28 are preferably composed of same material, such as both being composed of SiGe. Nevertheless, the epitaxial layer 30 could also be selected from the group consisting of Si, Ge, SiC, GaAs, InP, InGaAs, InAlP, and elementary group III-V compound semiconductors. Moreover, the concentration of the epitaxial layer 30 is preferably greater than the concentration of the buffer layer 28, such as the germanium concentration of the epitaxial layer 30 is greater than the germanium concentration of the buffer layer 28.

It should be noted that instead of employing the aforementioned embodiment of using sin-situly doping process to form buffer layer 28 with in-situ dopants, conducting another ion implant process to amorphize the buffer layer 28, and then forming the epitaxial layer 30, alternative embodiments of the present invention could be accomplished by forming a buffer layer 28 with in-situly doped dopants and then forming an epitaxial layer 30 directly through epitaxial growth process, or forming a buffer layer 28 without containing any dopants, conducting an ion implant process to implant ions carrying charge or not carrying charge into the buffer layer 28 for amorphization purpose, and then forming an epitaxial layer 30 on the buffer layer 28, which are all within the scope of the present invention.

Figure 5:
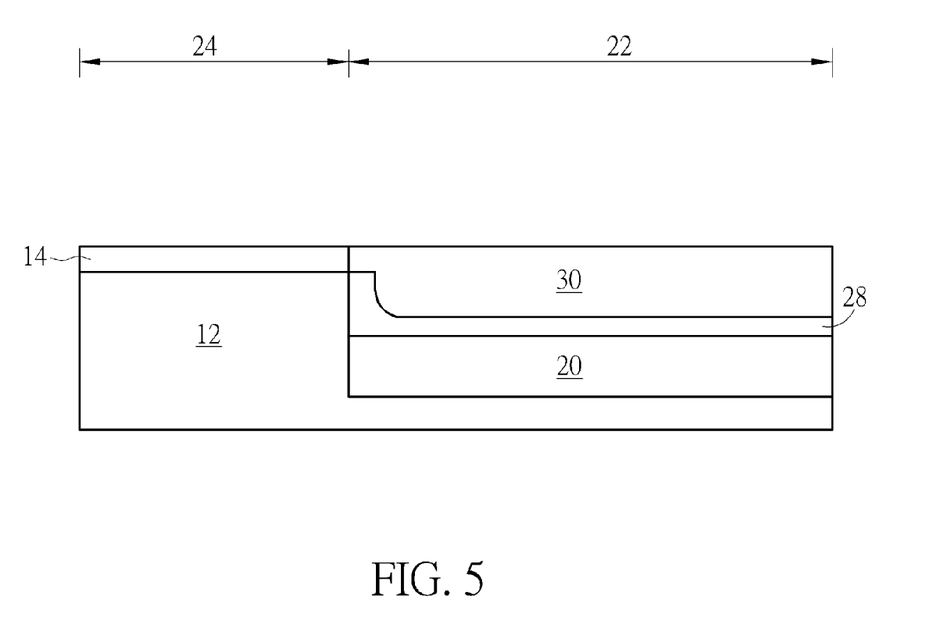

Next, as shown in FIG. 5, a planarizing process, such as a chemical mechanical polishing (CMP) process is conducted to remove part of the epitaxial layer 30 so that the top surface of the remaining epitaxial layer 30 is substantially even with the top surface of the surrounding hard mask 14. It should be noted that if no hard mask 14 were formed on the substrate 12 in FIG. 1, the top surface of the planarized epitaxial layer 30 at this stage is preferably even with the surface of the substrate 12.

Figure 6:
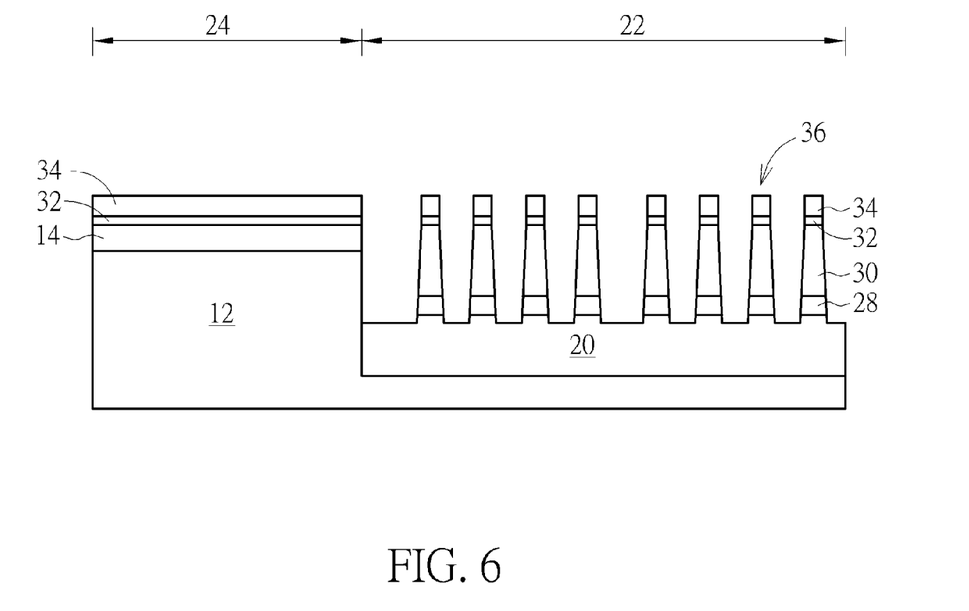

Next, as shown in FIG. 6, at least one hard mask could be formed on the hard mask 14 and the epitaxial layer 30, in which the at least one hard mask could further include a hard mask 32 composed of same material as the hard mask 14 and another hard mask 34 composed of different material. Next, a sidewall image transfer (SIT) process or a photo-etching process is conducted to remove part of the hard mask 34, part of the hard mask 32, part of the epitaxial layer 30, part of the buffer layer 28, and part of the substrate 12 on the active region 22 for forming fin-shaped structures 36. Since the formation of fin-shaped structures through SIT process or photo-etching process is well known to those skilled in the art, the details of which are not explained herein for the sake of brevity.

Figure 7:
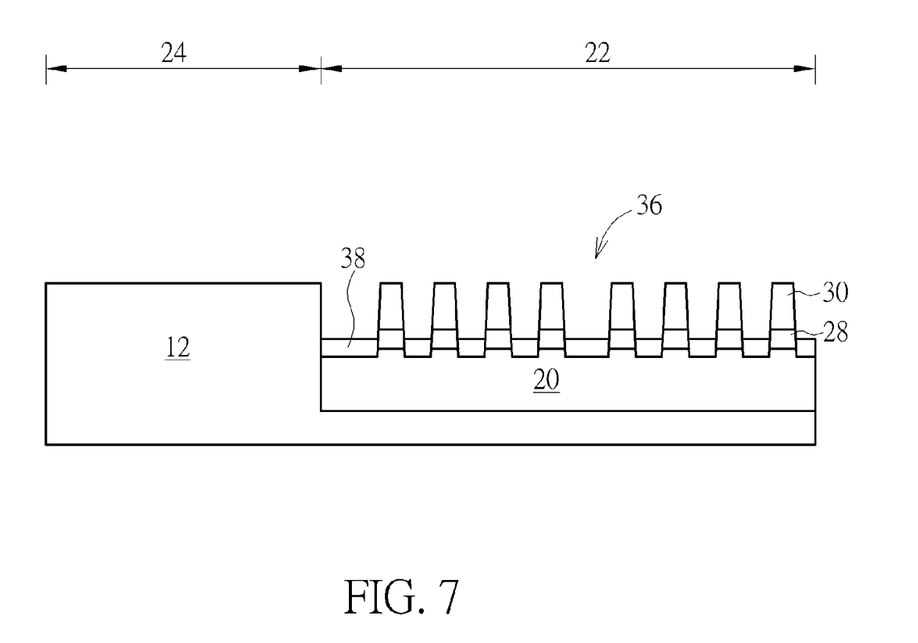

Next, as shown in FIG. 7, an insulating layer (not shown) is deposited to cover the hard mask 34 on the peripheral region 34 and the fin-shaped structures 36 on the active region 22 so that the insulating layer is higher than the top surface of the fin-shaped structures 36, and a planarizing process, such as CMP process is conducted to remove part of the insulating layer, the hard masks 34, 32, and 14 so that the top surface of the remaining insulating layer is even with the top surface of the epitaxial layer 30 of the fin-shaped structures 36. Next, an etching process is conducted to remove part of the insulating layer so that the top surface of the remaining insulating layer is slightly lower than the top surface of the fin-shaped structures 36. This forms a shallow trench isolation (STI) 38 around the fin-shaped structures 36.

Next, follow-up FinFET fabrication process could be conducted by forming gate structure on the fin-shaped structures 36, forming spacers adjacent to the gate structure and source/drain region in the fin-shaped structures 36 adjacent to the spacers. Next, a contact etch stop layer (CESL) could be formed to cover the gate structure, an interlayer dielectric (ILD) layer is formed on the CESL, and a replacement metal gate (RMG) process is selectively conducted to transform the gate structure into metal gate. Since the transformation from dummy gate to metal gate through RMG process is well known to those skilled in the art, the details of which are not explained herein for the sake of brevity. This completes the fabrication of a semiconductor device according to a first embodiment of the present invention.

Figure 8:
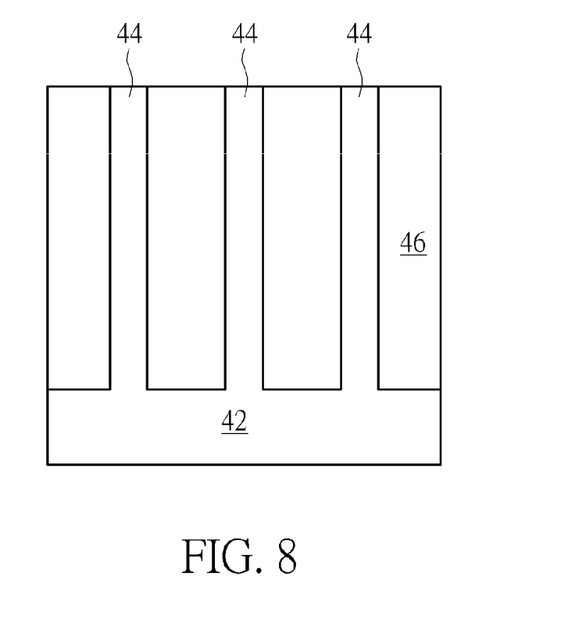
FIGS. 8-11 illustrate a method for fabricating semiconductor device according to a second embodiment of the present invention.

Referring to FIGS. 8-11, FIGS. 8-11 illustrate a method for fabricating semiconductor device according to a second embodiment of the present invention. As shown in FIG. 8, a substrate 42, such as a silicon substrate or a silicon-on-insulator (SOI) substrate is provided, and at least one fin-shaped structure 44 is formed on the substrate. It should be noted that even though three fin-shaped structures 44 are disclosed in this embodiment, the quantity of the fin-shaped structures 44 could be adjusted according to the demand of the product.

The fin-shaped structures 44 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 44 of this embodiment could also be obtained by first forming a patterned mask (not shown) on the substrate, 42, and through an etching process, the pattern of the patterned mask is transferred to the substrate 42 to form the fin-shaped structure 44. Moreover, the formation of the fin-shaped structure 44 could also be accomplished by first forming a patterned hard mask (not shown) on the substrate 42, and a semiconductor layer composed of silicon germanium is grown from the substrate 42 through exposed patterned hard mask via selective epitaxial growth process to form the corresponding fin-shaped structure 44. These approaches for forming fin-shaped structure 44 are all within the scope of the present invention.

Next, an insulating layer 46 is formed to cover the fin-shaped structures 44, and a planarizing process, such as CMP is conducted to remove part of the insulating layer 46 and even part of the fin-shaped structures 44 so that the top surface of the remaining insulating layer 46 is even with the top surface of the fin-shaped structures 44. The insulating layer 46 is preferably composed of silicon oxide, but not limited thereto.

Figure 9:
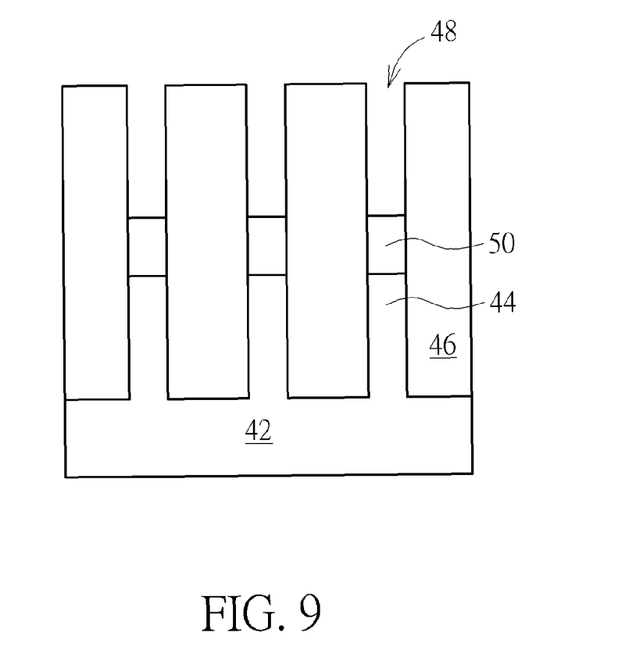

Next, as shown in FIG. 9, an etching process is conducted by using the insulating layer 46 as mask to remove part of the fin-shaped structures 44 to form a plurality of recesses 48. Next, a buffer layer 50 is formed in the recesses 48 without filling the recesses 48 completely, in which the buffer layer 50 is preferably composed of SiGe, but could also be selected from the group consisting of Si, Ge, SiC, GaAs, InP, InGaAs, InAlP, and elementary group III-V semiconductors.

Similar to the first embodiment, the formation of the buffer layer 50 could be accomplished by forming a buffer layer with in-situly doped dopants directly, in which the dopants within the buffer layer 50 is preferably selected from the ion group consisting of P, As, Sb, and Bi.

Next, another ion implantation process is conducted to alter the lattice structure of the buffer layer 50 through an amorphization process, in which the implanted dopants could be selected from the group consisting of P, As, Sb, Bi, C, and F.

Again, similar to the aforementioned embodiment, the dopants implanted into the buffer layer 50 from either in-situ doping process or extra ion implantation conducted thereafter could include one type or more types of dopants so that the buffer layer 50 formed could include at least three or more elements. Taking the buffer layer 50 composed of SiGe as an example, if at least one element or dopant such as phosphorus (P) is implanted into the buffer layer 50, the buffer layer 50 would eventually include silicon, germanium, and phosphorus. If one more element such as arsenic (As) is added to the buffer layer 50, the buffer layer 50 would have four elements including silicon, germanium, phosphorus, and arsenic. After the buffer layer containing dopants is formed, a thermal treatment could be conducted selectively to remove defect, repair lattice structure, and recrystallize.

Figure 10:
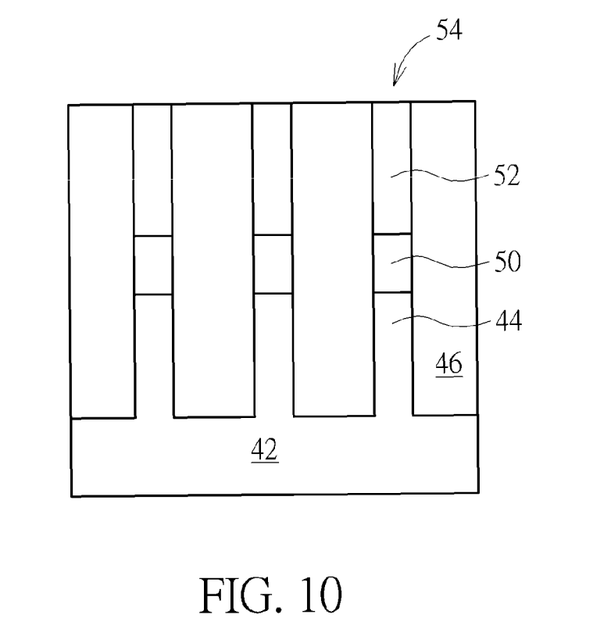

Next, as shown in FIG. 10, a growth process is conducted by using selective epitaxial growth process to form an epitaxial layer 52 on the buffer layer 50, in which a top surface of the epitaxial layer 52 is preferably higher than the top surfaces of the surrounding insulating layer 46. In this embodiment, the epitaxial layer 52 and buffer layer 50 are preferably composed of same material, such as both being composed of SiGe. Nevertheless, the epitaxial layer 52 could also be selected from the group consisting of Si, Ge, SiC, GaAs, InP, InGaAs, InAlP, and elementary group III-V semiconductors. Moreover, the concentration of the epitaxial layer 52 is preferably greater than the concentration of the buffer layer 50, such as the germanium concentration of the epitaxial layer 52 is greater than the germanium concentration of the buffer layer 50.

It should be noted that instead of employing the aforementioned embodiment of using sin-situly doping process to form buffer layer 50 with in-situ dopants, conducting another ion implant process to amorphize the buffer layer 50, and then forming the epitaxial layer 52, alternative embodiments of the present invention could be accomplished by forming a buffer layer 50 with in-situly doped dopants and then forming an epitaxial layer 52 directly through epitaxial growth process, or forming a buffer layer 50 without containing any dopants, conducting an ion implant process to implant ions carrying charge or not carrying charge into the buffer layer 50 for amorphization purpose, and then forming an epitaxial layer 52 on the buffer layer 50, which are all within the scope of the present invention.

Next, a planarizing process, such as CMP is conducted to remove part of the epitaxial layer 52 and even part of the insulating layer 46 so that the top surface of the remaining epitaxial layer 52 is even with the top surface of the insulating layer 46. At this stage, the original fin-shaped structures 44 and the newly formed buffer layer 50 and epitaxial layer 52 together form new fin-shaped structures 54.

Figure 11:
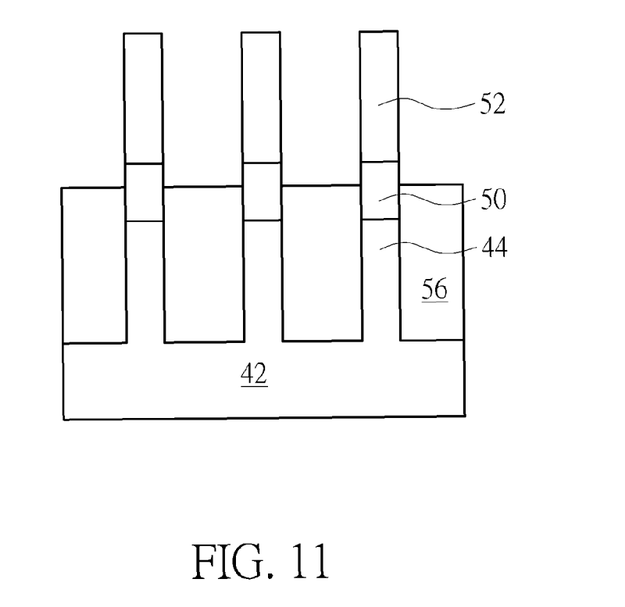

Next, as shown in FIG. 11, an etching process is conducted by using the epitaxial layer 52 as mask to remove part of the insulating layer 46 for forming a STI 56.

Next, follow-up FinFET fabrication process could be conducted by forming gate structure on the fin-shaped structures 54, forming spacers adjacent to the gate structure and source/drain region in the fin-shaped structures 54 adjacent to the spacers. Next, a contact etch stop layer (CESL) could be formed to cover the gate structure, an interlayer dielectric (ILD) layer is formed on the CESL, and a replacement metal gate (RMG) process is selectively conducted to transform the gate structure into metal gate. Since the transformation from dummy gate to metal gate through RMG process is well known to those skilled in the art, the details of which are not explained herein for the sake of brevity. This completes the fabrication of a semiconductor device according to a second embodiment of the present invention.

According to an embodiment of the present invention, it would also be desirable to remove part of the fin-shaped structures for forming plurality of recesses after a gate structure is formed on the fin-shaped structures, forma buffer layer in the recesses without filling the recesses completely, and then implant dopants into the buffer layer according to aforementioned dopant selections so that the buffer layer formed could be amorphized while serving as a stress adjustment and doped isolation structure between well region and epitaxial layer. Next, a thermal treatment could be conducted selectively and an epitaxial layer is formed on the buffer layer through selective epitaxial growth process.

Figure 12:
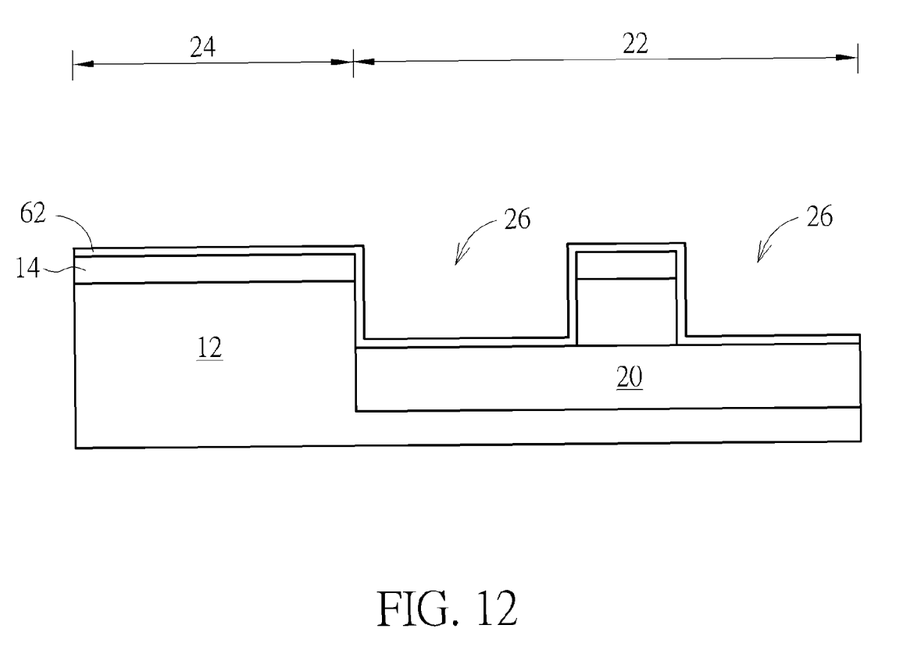
FIGS. 12-16 illustrate a method for fabricating a semiconductor device according to a third embodiment of the present invention.

Referring to FIGS. 12-16, FIGS. 12-16 illustrate a method for fabricating a semiconductor device according to a third embodiment of the present invention. As shown in FIG. 12, after forming recesses 26 in the substrate 12 and then stripping the patterned resist 16 as disclosed in FIGS. 1-2, a liner or pad layer 62 is deposited on the surface of the hard mask 14 and into the recesses 26 while not filling the recesses 26 completely. Preferably, the pad layer 62 filled into the recess 26 is disposed on the surface of the well 20 and the exposed sidewalls of the substrate 12.

In this embodiment, the material of the pad layer 62 could be the same as or different from the material of the hard mask 14, in which the pad layer 62 is preferably composed of silicon oxide while the hard mask 14 could be selected from the group consisting of silicon oxide and silicon nitride, but not limited thereto.

Figure 13:
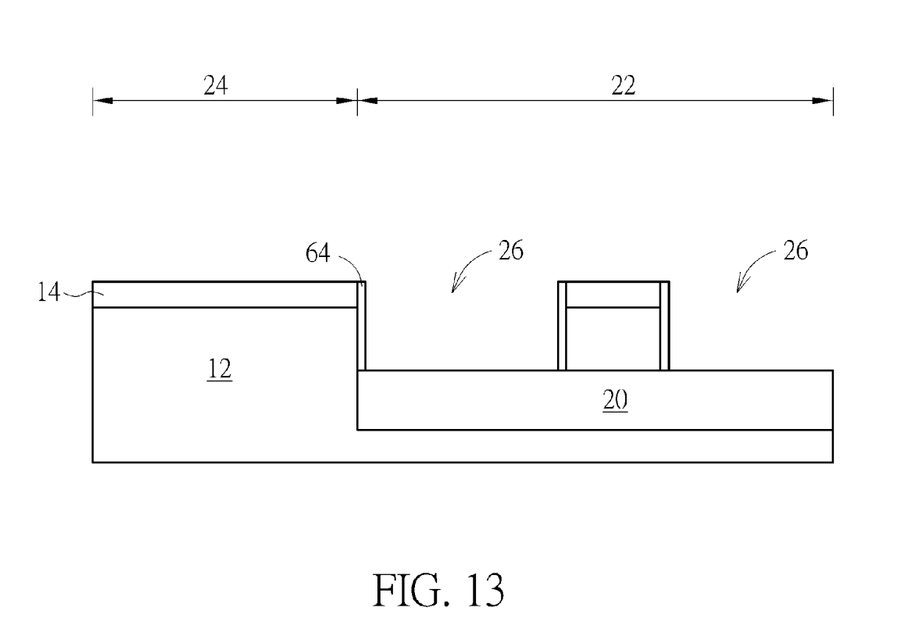

Next, as shown in FIG. 13, an etching process is conducted to remove part of the pad layer 62 on the hard mask 14 and part of the pad layer 62 on the well 20 surface. This exposes the hard mask 14 surface and part of the well 20 surface and forms spacers 64 on the sidewalls of the exposed substrate 12, in which the top surface of the spacers 64 is even with the top surface of the hard mask 14.

Figure 14:
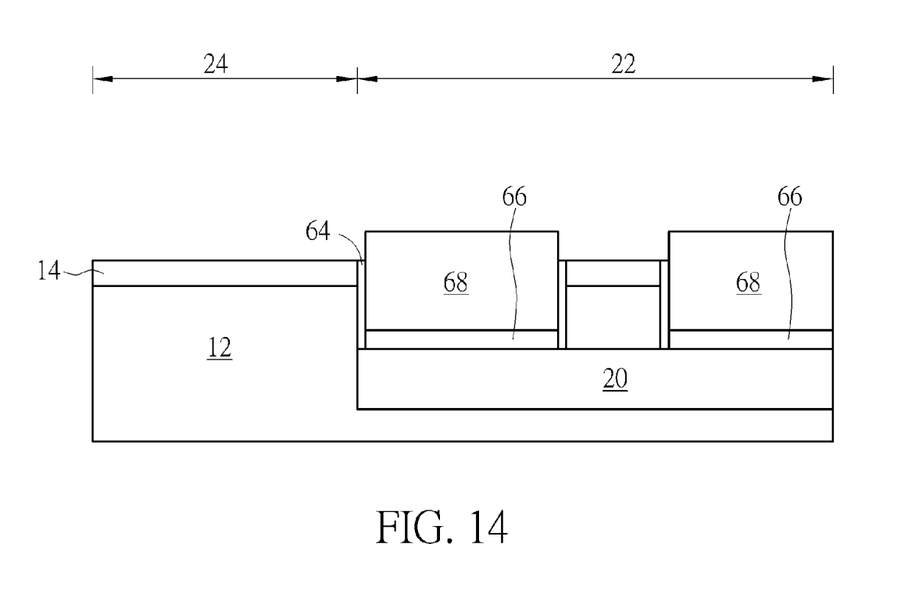

Next, as shown in FIG. 14, a buffer layer 66 and an epitaxial layer 68 are formed into the recesses 26 and filling the recesses 26 completely. Preferably, the buffer layer 66 is preferably a buffer material layer utilized for adjusting stress, which is preferably composed of silicon germanium (SiGe), but could also be selected from the group consisting of Si, Ge, SiC, GaAs, InP, InGaAs, InAlP, and elementary group III-V semiconductors. Similar to the aforementioned embodiments, the formation of the buffer layer 66 could be accomplished by forming a buffer layer with in-situly doped dopants directly, in which the dopants within the buffer layer 66 is preferably selected from the ion group consisting of P, As, Sb and Bi.

Next, another ion implantation process is conducted to alter the lattice structure of the buffer layer 66 through an amorphization process, in which the ions implanted could be selected from dopants not carrying charge or dopants carrying charge. If the implanted dopants were dopants not carrying charge, the buffer layer 66 formed could be serving as a stress adjustment layer between the well 20 and epitaxial layer 68 formed afterwards. If the implanted dopants were dopants carrying charge and due to the fact that the implanted dopants and the well 20 share same conductive type and the concentration of the ions is higher than the well 20, the buffer layer 66 formed could be serving as a stress adjustment layer as well as an isolation structure between the well 20 and an epitaxial layer 68 formed afterwards. In this embodiment, the implanted dopants could be selected from the group consisting of P, As, Sb, Bi, C, and F.

It should be noted that the aforementioned dopants implanted into the buffer layer 66 from in-situ doping process or an extra ion implantation thereafter could include one type or more types of dopants listed above, so that the buffer layer 66 formed could include at least three or more elements. Taking the buffer layer 66 composed of SiGe as an example, if at least one element or dopant such as phosphorus (P) is implanted into the buffer layer 66, the buffer layer 66 would eventually include silicon, germanium, and phosphorus. If one more element such as arsenic (As) is added to the buffer layer 66, the buffer layer 66 would have four elements including silicon, germanium, phosphorus, and arsenic. After the buffer layer 66 containing dopants is formed, a thermal treatment could be conducted selectively to remove defect, repair lattice structure, and recrystallize.

After the buffer layer 66 is formed, a growth process is conducted by using selective epitaxial growth process to form epitaxial layer 68 on the buffer layer 66, in which a top surface of the epitaxial layer 68 is preferably higher than the top surfaces of the surrounding substrate 12 and hard mask 14. In this embodiment, the epitaxial layer 68 and buffer layer 66 are preferably composed of same material, such as both being composed of SiGe. Nevertheless, the epitaxial layer 68 could also be selected from the group consisting of Si, Ge, SiC, GaAs, InP, InGaAs, InAlP, and elementary group III-V semiconductors. Moreover, the concentration of the epitaxial layer 68 is preferably greater than the concentration of the buffer layer 66, such as the germanium concentration of the epitaxial layer 68 is greater than the germanium concentration of the buffer layer 66.

It should be noted that instead of employing the aforementioned embodiment of using sin-situly doping process to form buffer layer 66 with in-situ dopants, conducting another ion implant process to amorphize the buffer layer 66, and then forming the epitaxial layer 68, an alternative embodiment of the present invention could be accomplished by forming a buffer layer 66 with in-situly doped dopants and then forming an epitaxial layer 68 directly through epitaxial growth process, or forming a buffer layer 66 without containing any dopants, conducting an ion implant process to implant ions carrying charge or not carrying charge into the buffer layer 66 for amorphization purpose, and then forming an epitaxial layer 68 on the buffer layer 66, which are all within the scope of the present invention.

Figure 15:
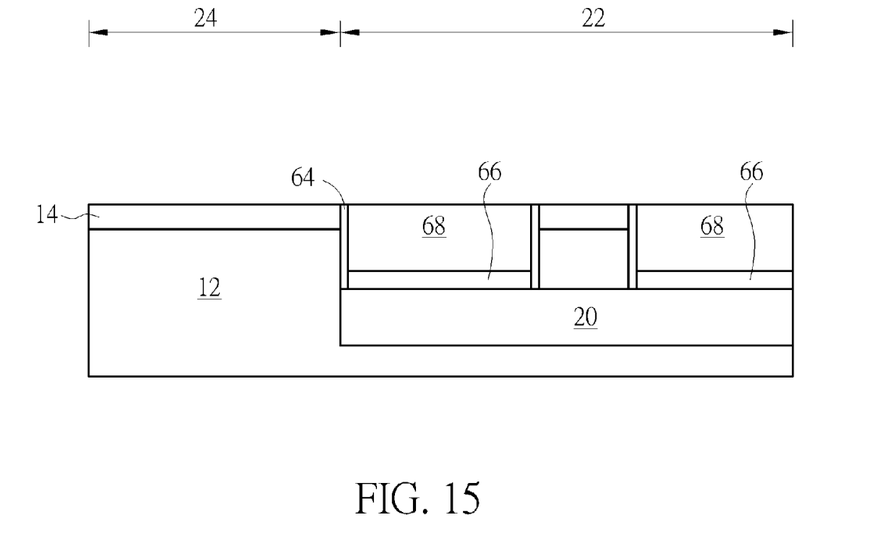

Next, as shown in FIG. 15, a planarizing process, such as a chemical mechanical polishing (CMP) process is conducted to remove part of the epitaxial layer 68 so that the top surface of the remaining epitaxial layer 68 is substantially even with the top surface of the surrounding hard mask 14. It should be noted that if no hard mask 14 were formed on the substrate 12 in FIG. 1, the top surface of the planarized epitaxial layer 68 at this stage is preferably even with the surface of the substrate 12.

Figure 16:
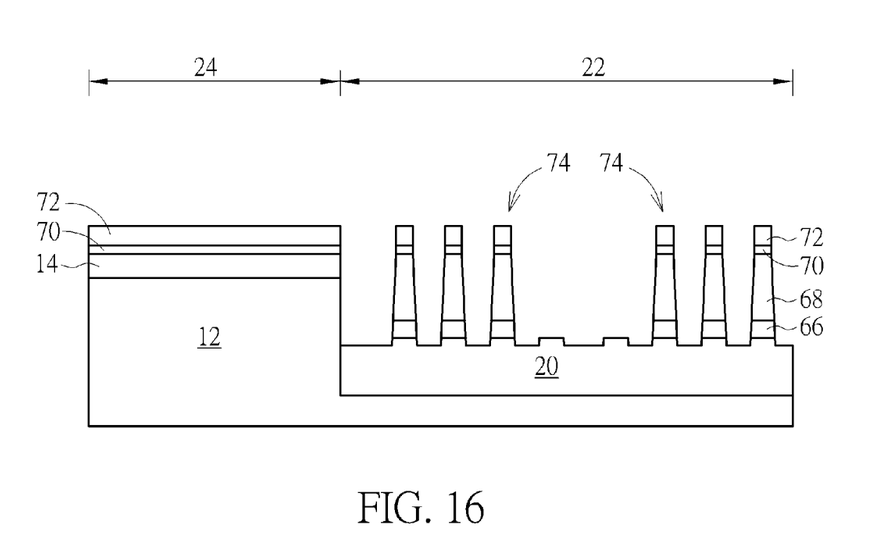

Next, as shown in FIG. 16, at least one hard mask could be formed on the hard mask 14 and the epitaxial layer 68, in which the at least one hard mask could further include a hard mask 70 composed of same material as the hard mask 14 and another hard mask 72 composed of different material. Next, a sidewall image transfer (SIT) process or a photo-etching process is conducted to remove part of the hard mask 72, part of the hard mask 70, part of the epitaxial layer 68, part of the buffer layer 66, and part of the substrate 12 on the active region 22 for forming fin-shaped structures 74. Since the formation of fin-shaped structures through SIT process or photo-etching process is well known to those skilled in the art, the details of which are not explained herein for the sake of brevity.

It should be noted that typical epitaxial buffer layer and epitaxial layer formed in a recess were grown through selective epitaxial growth process from silicon substrate either underneath the epitaxial buffer layer and/or around the epitaxial buffer layer. The epitaxial buffer layer formed through this manner typically reveals a substantially U-shaped gradient profile, in which the concentration gradient of the epitaxial buffer layer could vary either inwardly or outwardly along the U-shaped profile. This induces a problem when poor fin-cut process were conducted in the later stage to form fin-shaped structures containing vertical edge portions of the U-shaped profile of the epitaxial buffer layer. By forming spacers 64 preferably made of dielectric material in the recesses 26 to surround the buffer layer 66 and epitaxial layer 68, the present embodiment ensures that the buffer layer 66 formed in the recesses 26 would have a horizontal I-shaped profile instead of a U-shaped profile and further guarantees that the fin-shaped structures formed afterwards would have a much more uniform gradient distribution.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for fabricating semiconductor device, comprising:
   providing a substrate;
   forming a recess in the substrate;
   forming a buffer layer in the recess;
   forming an epitaxial layer on the buffer layer; and
   removing part of the epitaxial layer, part of the buffer layer, and part of the substrate to form fin-shaped structures.

2. The method of claim 1, further comprising:
   performing an implant process to form a well in the substrate; and
   removing part of the well to form the recess.

3. The method of claim 1, further comprising:
   forming the recess; and
   performing an implant process to form a well in the substrate and under the recess.

4. The method of claim 1, wherein the buffer layer comprises silicon germanium (SiGe).

5. The method of claim 4, further comprising performing an implant process to implant dopants into the buffer layer.

6. The method of claim 5, wherein the dopants are selected from the group consisting of P, As, Sb, Bi, C, and F.

7. The method of claim 1, further comprising forming the buffer layer with in-situly doped dopants.

8. The method of claim 7, wherein the dopants are selected from the group consisting of P, As, Sb, Bi, C, and F.

9. The method of claim 1, further comprising performing an anneal process after forming the buffer layer and before forming the epitaxial layer.

10. The method of claim 1, further comprising:
    forming a pad layer on the substrate and into the recess;
    removing part of the pad layer to form spacers in the recess;
    forming the buffer in the recess; and
    forming the epitaxial layer on the buffer layer; and
    removing the spacers, part of the epitaxial layer, part of the buffer layer, and part of the substrate to form fin-shaped structures.

11. A method for fabricating semiconductor device, comprising:
    providing a substrate;
    forming a fin-shaped structure on the substrate and an insulating layer around the fin-shaped structure;
    removing part of the fin-shaped structure for forming a recess;
    forming a buffer layer in the recess;
    forming an epitaxial layer on the buffer layer; and
    removing part of the insulating layer to form a shallow trench isolation (STI).

12. The method of claim 11, wherein the buffer layer comprises silicon germanium (SiGe).

13. The method of claim 12, further comprising forming the buffer layer with in-situly doped dopants.

14. The method of claim 13, wherein the dopants are selected from the group consisting of P, As, Sb, Bi, C, and F.

15. The method of claim 12, further comprising performing an implant process to implant dopants into the buffer layer.

16. The method of claim 15, wherein the dopants are selected from the group consisting of P, As, Sb, Bi, C, and F.

17. The method of claim 11, further comprising performing an anneal process after forming the buffer layer and before forming the epitaxial layer.

* * * * *